United States Patent [19]
Beatty et al.

[11] Patent Number: 5,748,489
[45] Date of Patent: *May 5, 1998

[54] PARALLEL EXECUTION OF A COMPLEX TASK PARTITIONED INTO A PLURALITY OF ENTITIES

[75] Inventors: Harry John Beatty, Clinton Corners; Peter Claude Elmendorf, Kingston; Roland Roberto Gillis, Ulster Park; Ira Pramanick, Wappingers Falls, all of N.Y.

[73] Assignee: International Business Machines Corporation, Armonk, N.Y.

[*] Notice: The term of this patent shall not extend beyond the expiration date of Pat. No. 5,602,754.

[21] Appl. No.: 453,680

[22] Filed: May 30, 1995

Related U.S. Application Data

[62] Division of Ser. No. 347,641, Nov. 30, 1994.

[51] Int. Cl.$^6$ .................. G06F 17/50; G06F 13/16; G06F 13/18
[52] U.S. Cl. .............. 364/489; 364/488; 364/578; 364/DIG. 2; 395/500; 395/650; 395/200.05
[58] Field of Search .................. 364/578, 488, 364/900, 489, DIG. 2; 395/425, 275, 500, 575, 375, 650

[56] References Cited

U.S. PATENT DOCUMENTS

| | | |
|---|---|---|
| 4,263,651 | 4/1981 | Donath et al. .............. 364/300 |
| 4,306,286 | 12/1981 | Cocke et al. .............. 364/200 |
| 4,622,550 | 11/1986 | O'Connor et al. .............. 340/825.05 |
| 4,656,580 | 4/1987 | Hitchcock, Sr. et al. .............. 364/200 |
| 4,697,241 | 9/1987 | Lavi .............. 364/488 |
| 4,698,760 | 10/1987 | Lembach et al. .............. 364/490 |
| 4,700,292 | 10/1987 | Campanini .............. 364/200 |
| 4,725,975 | 2/1988 | Sasaki .............. 364/900 |
| 4,751,637 | 6/1988 | Catlin .............. 364/200 |
| 4,763,288 | 8/1988 | Deering et al. .............. 364/578 |
| 4,827,428 | 5/1989 | Dunlop et al. .............. 364/491 |
| 4,872,125 | 10/1989 | Catlin .............. 364/578 |
| 4,907,180 | 3/1990 | Smith .............. 364/578 |
| 5,003,487 | 3/1991 | Drumm et al. .............. 364/489 |
| 5,095,453 | 3/1992 | Huang .............. 364/578 |
| 5,109,353 | 4/1992 | Sample et al. .............. 364/578 |
| 5,113,523 | 5/1992 | Colley et al. .............. 395/800 |
| 5,410,654 | 4/1995 | Foster et al. .............. 395/275 |

*Primary Examiner*—Kevin J. Teska
*Assistant Examiner*—Thai Phan
*Attorney, Agent, or Firm*—Lynn L. Augspurger; Blanche E. Schiller

[57] ABSTRACT

In order to efficiently execute a complex task within a computer system, the task is partitioned into a plurality of entities. A master process and a slave process are started for each entity. The master processes schedule operations to be performed, while the slave processes perform the operations. One slave process is coupled to one or more other slave processes because of path interconnections between the entities. Communication is established between any coupled slave processes such that one slave process may directly communicate with another slave process without involving the master processes. The master and slave processes execute in parallel on a plurality of processors.

12 Claims, 8 Drawing Sheets fig. 1 fig. 2 fig. 3 fig. 4 fig. 5a fig. 5b fig. 6 fig. 7

PARALLEL EXECUTION OF A COMPLEX TASK PARTITIONED INTO A PLURALITY OF ENTITIES

This application is a division of application Ser. No. 08/347,641, filed Nov. 30, 1994.

TECHNICAL FIELD

The present invention relates in general to the managing and processing of complex tasks in a computer system, and in particular, to partitioning a complex task into a number of processes, which are processed in parallel.

CROSS-REFERENCE TO RELATED APPLICATION

This application contains subject matter which is related to the subject matter of the following application, which is assigned to the same assignee of this application. The below listed application is hereby incorporated herein by reference in its entirety:

"A Method and System for Parallel Processing of Timing Operations," by Hatch et al., Ser. No. 08/347,642, Filed: On even date herewith.

BACKGROUND ART

As is known, computers are capable of performing a wide variety of tasks ranging from simple tasks to very involved tasks. However, some tasks cannot be executed efficiently, since they are too large to be held in memory, run too slow on one processor or require too many resources. These tasks are referred to as complex tasks. One example of a complex task is a static timing analysis of a logic design.

During static timing analysis, a new design is timed to determine if it meets predetermined specifications. The design includes thousands of logic circuits and many interconnection paths between the circuits. As is known, the output of one circuit may be an input to another circuit. Since the timing value of one circuit is needed before timing can be calculated for a connected circuit, static timing has traditionally been performed serially. This disadvantageously takes a great deal of time and resources.

Previously, efforts have been made to improve the overall processing time of a design such that the design meets the predetermined specification. For instance, in U.S. Pat. No. 4,698,760, entitled "Method Of Optimizing Signal Timing Delays and Power Consumption in LSI Circuits," issued on Oct. 6, 1987, a method is described for optimizing signal timing delays through LSI circuits by proper selection of circuit power levels. Power levels for individual logic blocks are selected such that overall system timing requirements are met.

However, the problem associated with improving the performance of timing a design to determine if it meets the predefined specifications has not been adequately dealt with. Therefore, a need exists for a technique to increase the performance associated with execution of complex tasks, and in particular, the performance associated with static timing. A further need exists for a technique to incrementally substitute part of the design when the design does not adequately meet the specification or the designer wishes to change the design.

SUMMARY OF THE INVENTION

The shortcomings of the prior art are overcome and additional advantages are realized through the provision of a method and system for executing complex tasks in a computer system. The complex task is partitioned into a plurality of entities. Each of the plurality of entities comprises a master process and a slave process. The slave process of one entity is coupled to one or more slave processes of other entities. Communication is established between the coupled slave processes, such that data is communicated directly between the coupled slave processes. The master and slave processes are executed on one or more processors of the computer system.

In one embodiment, the master and slave processes are executed in parallel. Also, in another embodiment, the complex task is a static timing operation. In yet a further embodiment, one of the entities is replaced by a replaceable entity, which is capable of having a different structure from the entity being replaced.

In another aspect of the invention, a system for executing complex tasks in a computer system is provided. The system includes means for partitioning the complex task into a plurality of entities. Each entity comprises a master process and a slave process. A slave process of one entity is coupled to one or more slave processes of other entities. Means for establishing communication between the coupled slave processes and means for executing the master and slave processes are also provided.

The method and system of the present invention for executing complex tasks advantageously enables parallel processing of the task, thereby increasing system performance. Additionally, the present invention allows incremental substitution of part of a design without requiring the whole design to be timed again. Further, the present invention decreases communication, since slave processes communicate directly with other slave processes. Additionally, communication is minimized, since only changes are propagated through the system.

Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description taken in conjunction with the accompanying drawings in which:

BEST MODE FOR CARRYING OUT THE INVENTION

The present invention is directed to the efficient processing of complex tasks executing within a computer system. Complex tasks are those tasks which are too large to fit within the memory of the computer system or require too many resources or too much time to execute. One example of a complex task is a static timing operation performed on a new design of a computer system, a computer module, a computer chip or any collection of integrated circuits, as examples. As is known, static timing is used to predict how well the design performs. In particular, the design has a performance specification associated therewith, and static timing is used to determine whether the design meets that specification. If the design does not meet the specification, then the design is altered accordingly.

Figure 1:
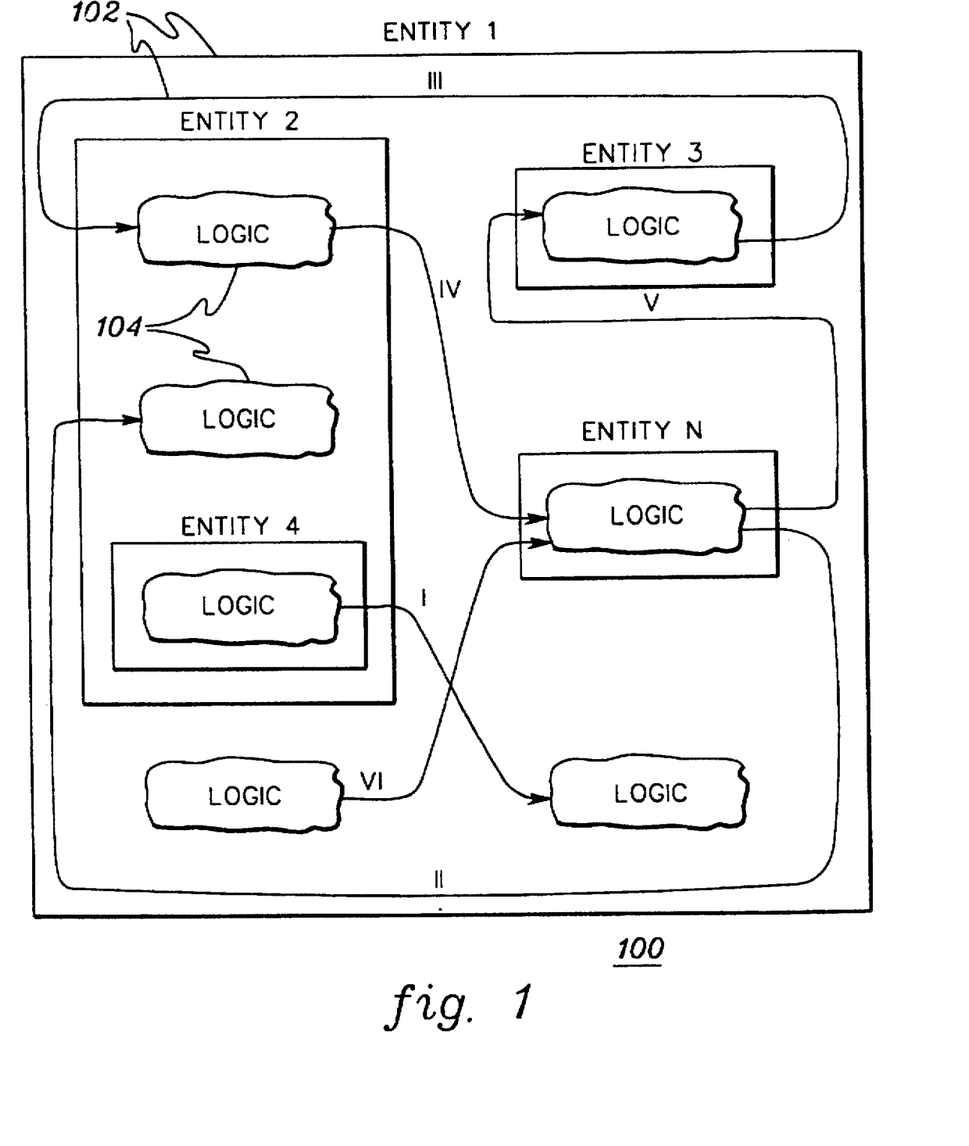
FIG. 1 depicts one example of a design partitioned into a plurality of entities, in accordance with the principles of the present invention.

One example of a design is depicted in FIG. 1. This design is, for instance, the design of an integrated circuit chip, integrated circuit chips on a module or any design which can be decomposed into pieces. In one embodiment, the design is partitioned by the designers into a plurality of logical units, referred to herein as entities. The partitioning is designer specific. For instance, in one example, the design is partitioned into hierarchical entities as determined by the designer. However, in another embodiment, there may be no hierarchy specified by the designer. Additionally, in a further embodiment, it is possible for the design to be partitioned into entities by a specified algorithm rather than by a designer.

In the example depicted in FIG. 1, a design 100 includes a plurality of entities 102 (i.e., entity 1, entity 2 . . . entity N). As one embodiment, entity 1 contains entities 2 . . . N, and thus, entity 1 is considered decomposable. Similarly, entity 2 contains entity 4 and thus, is also considered decomposable. However, entities 3, 4, and N do not contain any other entities and therefore, they are considered non-decomposable. The decomposition possibilities of an entity are designer specific. In particular, an indication of whether each entity is decomposable is stored within, for instance, a control file located in a computer system which will perform the complex task.

In accordance with the principles of the present invention, different entities may be implemented in different hardware technologies. For example, an entity of a design (e.g., modules of a card) may be bipolar, CMOS, or come from different manufacturers.

Within each entity resides some complex logic 104, which is summarily depicted in FIG. 1. In one embodiment, the complex logic includes random logic circuits, such as AND gates and OR gates, and other devices, such as storage devices, etc. Path interconnections between the entities are represented by the curved lines designated with Roman numerals. Each path starts, for example, at a launching storage element and ends at a capturing storage element. The path is capable of spanning one or more entities. For instance, path I is launched in entity 4 and is captured in entity 1 crossing one entity boundary. Likewise, the other path interconnections require zero, one, two or three entity crossings. The system will handle designs that have N entity crossings.

Complex tasks, such as static timing operations, are applied to design 100. An overview of the execution of one such complex task, in accordance with the principles of the present invention, is described with reference to FIG. 2. Initially, at least one master process and one slave process are started (spawned) for each entity, STEP 200 "START MASTER AND SLAVE PROCESSES." The role of the master processes is to schedule the operations to be performed by the slave processes, and the role of the slave processes is to perform the actual operations. Spawning is described in further detail below with reference to FIGS. 4 and 5a–5b.

Figure 2:
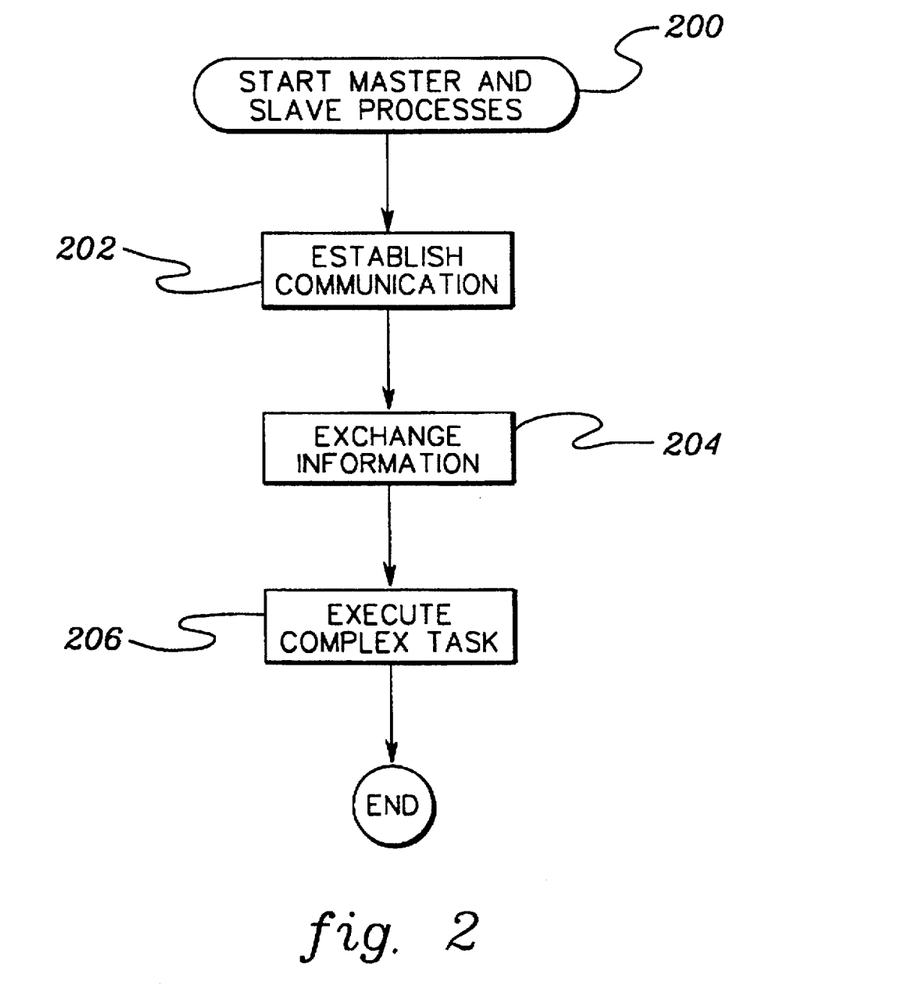
FIG. 2 depicts one example of an overview of the logic associated with performing a complex task on the logic design of FIG. 1, in accordance with the principles of the present invention.
Figure 6:
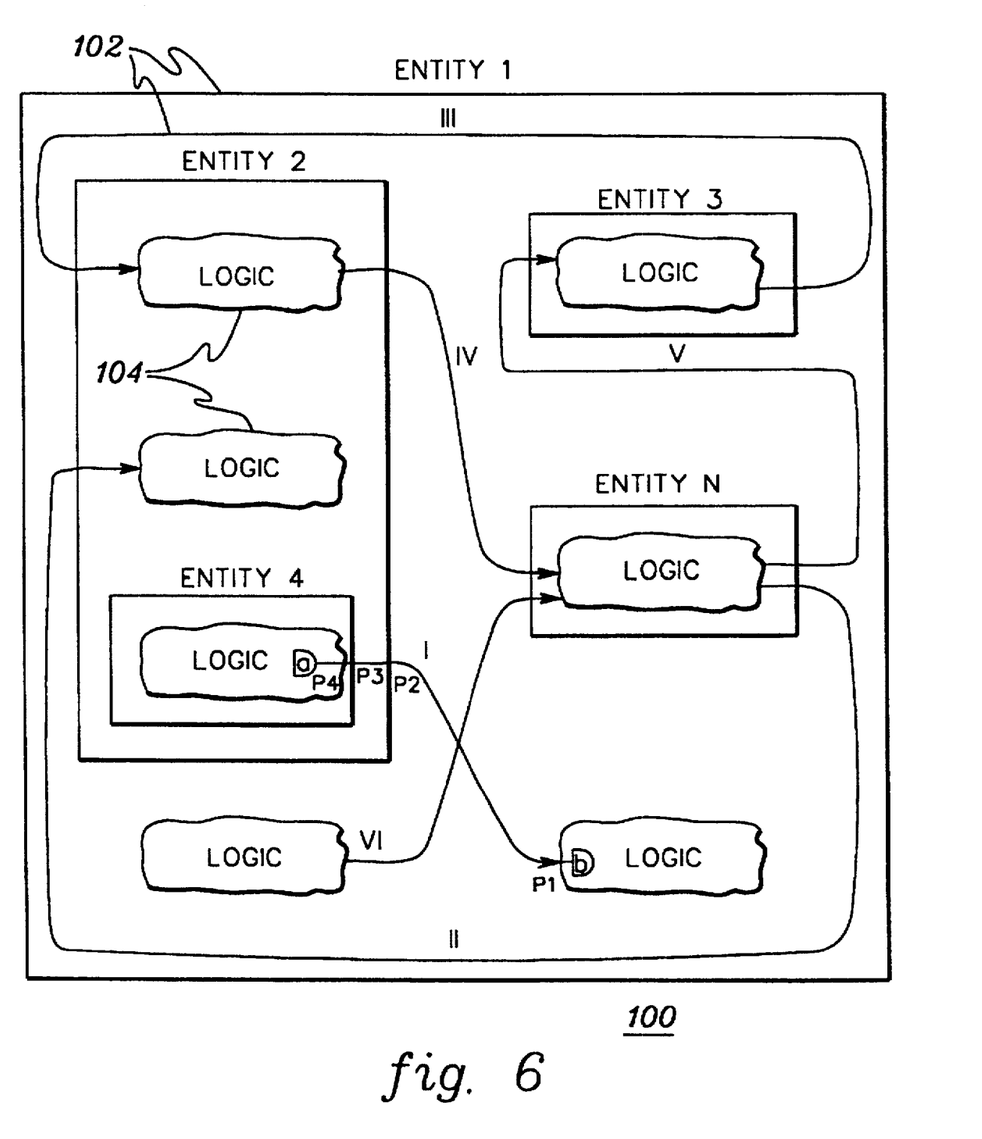
FIG. 6 depicts one example of a pin expansion, in accordance with the principles of the present invention.
Figure 7:
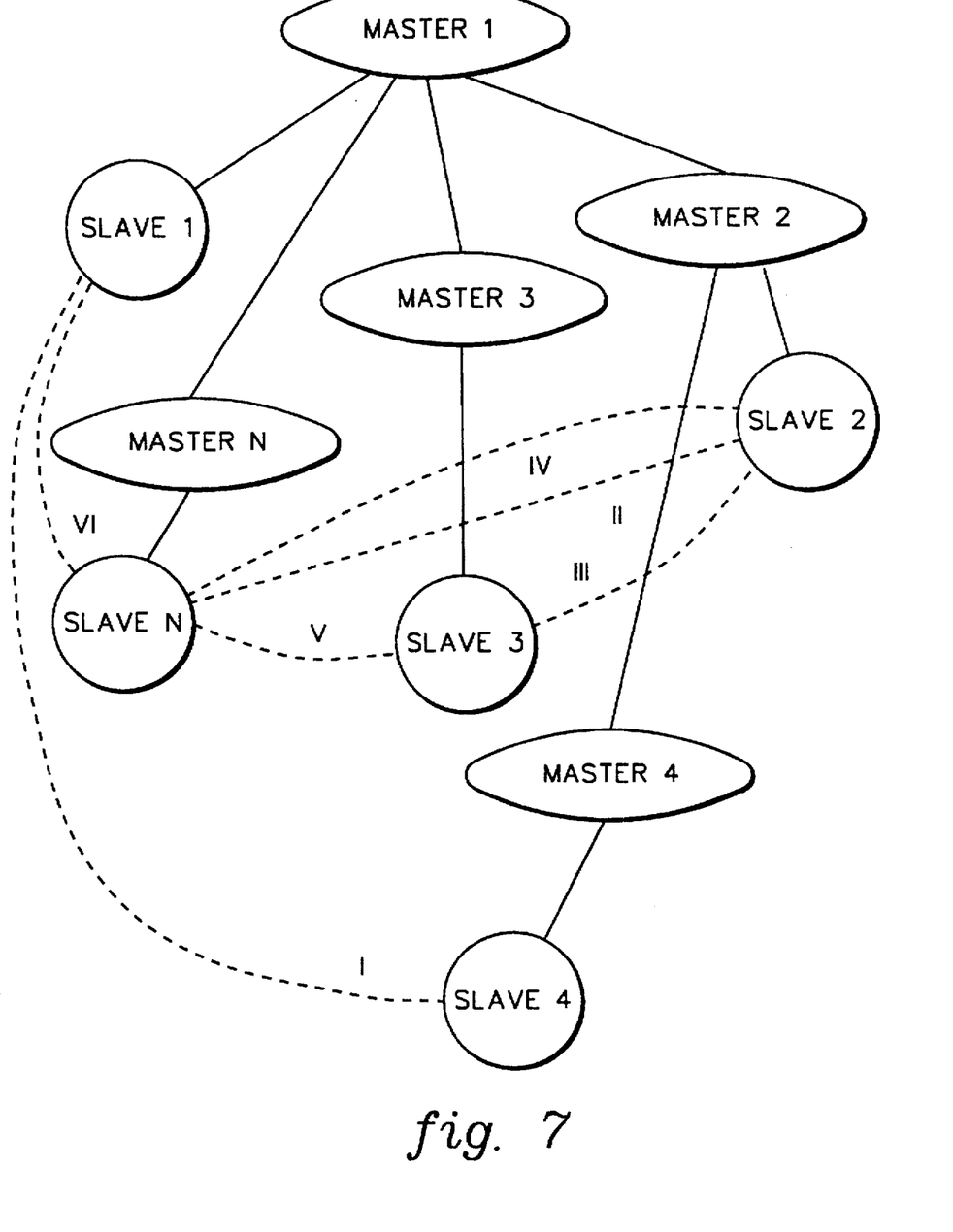
FIG. 7 depicts one embodiment of the communication between adjacent slave processes, in accordance with the principles of the present invention.

After spawning is complete, the root master process (e.g., Master 1) issues a command to establish communication between slave processes that are adjacent to one another, STEP 202 "ESTABLISH COMMUNICATION." One aspect of establishing communication is forward pin expansion, which is described below with reference to FIG. 6. Additionally, one example of adjacent slave processes is depicted in FIG. 7.

Subsequent to establishing communication, circuit topology, technology specific information and/or physical design information is exchanged between adjacent slave processes, STEP 204 "EXCHANGE INFORMATION." Thereafter, specific operations of the complex task are executed in parallel. In particular, the slave processes perform the actual operations, such as the timing calculations, and the master processes schedule the operations, STEP 206 "EXECUTE COMPLEX TASK." In one embodiment, the slave processes and the master processes execute in parallel. When the complex task is complete, the results are studied to determine if, for instance, the design meets the specification. If the design does not meet the specification, then modifications are made and the design is re-evaluated.

In accordance with the principles of the present invention, the master and slave processes are executed on a plurality of processors of a computer system in order to decrease processing time of the complex task. As one example, each process is executed on a different processor. As a further example, a master process and a slave process are run on one processor. As a further example, a mixture of master and slave process(es) may run on one processor. An additional example includes a combination of the above. One example of a computer system for executing complex tasks is described in detail with reference to FIG. 3.

Figure 3:
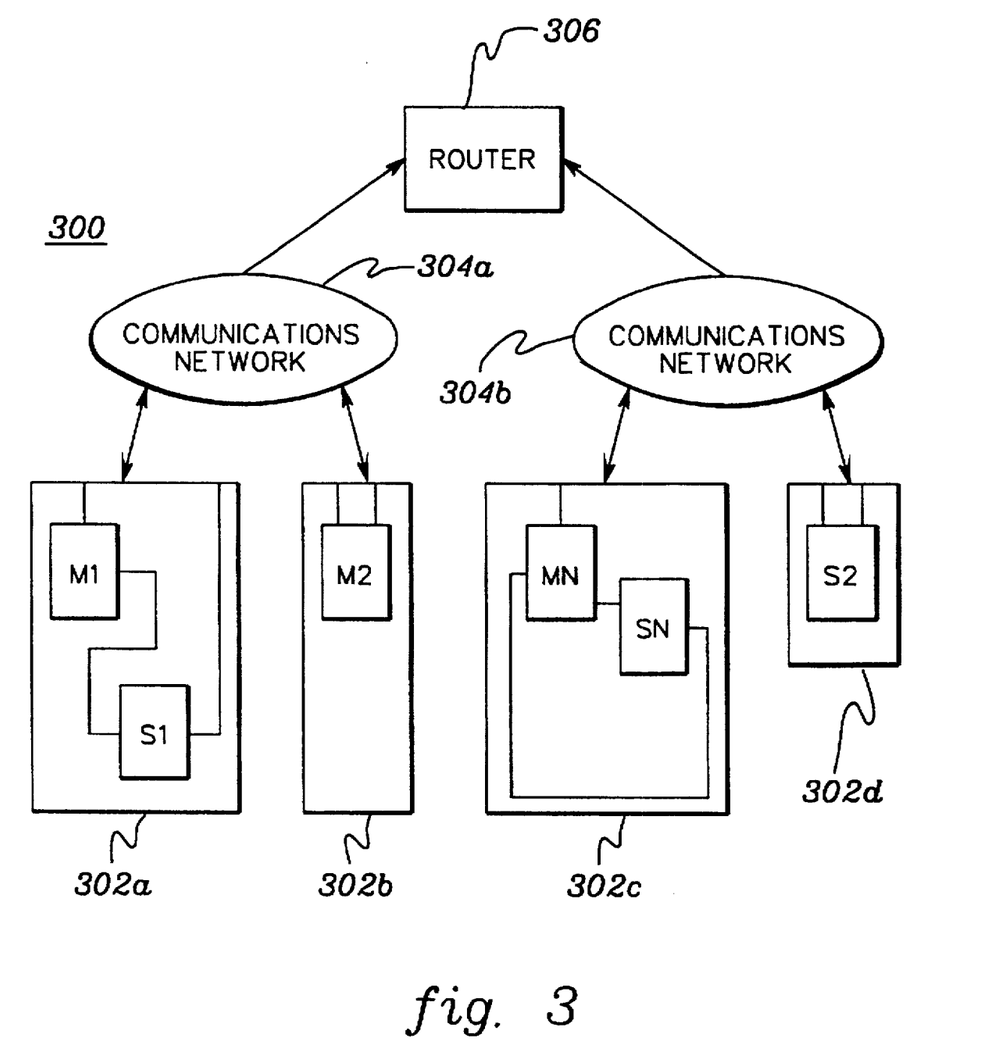
FIG. 3 depicts one example of a computer system for processing a complex task, in accordance with the principles of the present invention.

Referring to FIG. 3, a computer system 300 includes a plurality of processors 302a–302d. A processor is defined as a computing device or a device capable of operating a program. The plurality of processors do not necessarily have to be of the same type, architecture, configuration, capacity or capability. One example of processors 302a–302d is a RISC/6000 offered by International Business Machines Corporation. In the example illustrated in FIG. 3, processors 302a and 302b are coupled to one another via a communications network 304a, and similarly, processors 302c and 302d are coupled via a communications network 304b. The communications network is, for instance, a local area network (LAN). Additionally, communications networks 304a and 304b are coupled to one another through a standard router 306. It will be apparent to one of ordinary skill in the art that other network arrangements are possible without departing from the spirit of the invention. For instance, there may be only one communications network eliminating the need for the router. Other possibilities also exist.

As shown, each processor executes one or more processes. As one particular example, processor 302a is executing master process 1 (M1) and slave process 1 (S1), while processor 302b is only executing master process 2 (M2). Likewise, processor 302c is processing master process N (MN) and slave process N (SN), while processor 302d is processing slave process 2 (S2). Once again, computer system 300 can include additional processors for processing other processes or additional processes can be executed within one or more of processors 302a-302d.

Figure 4:
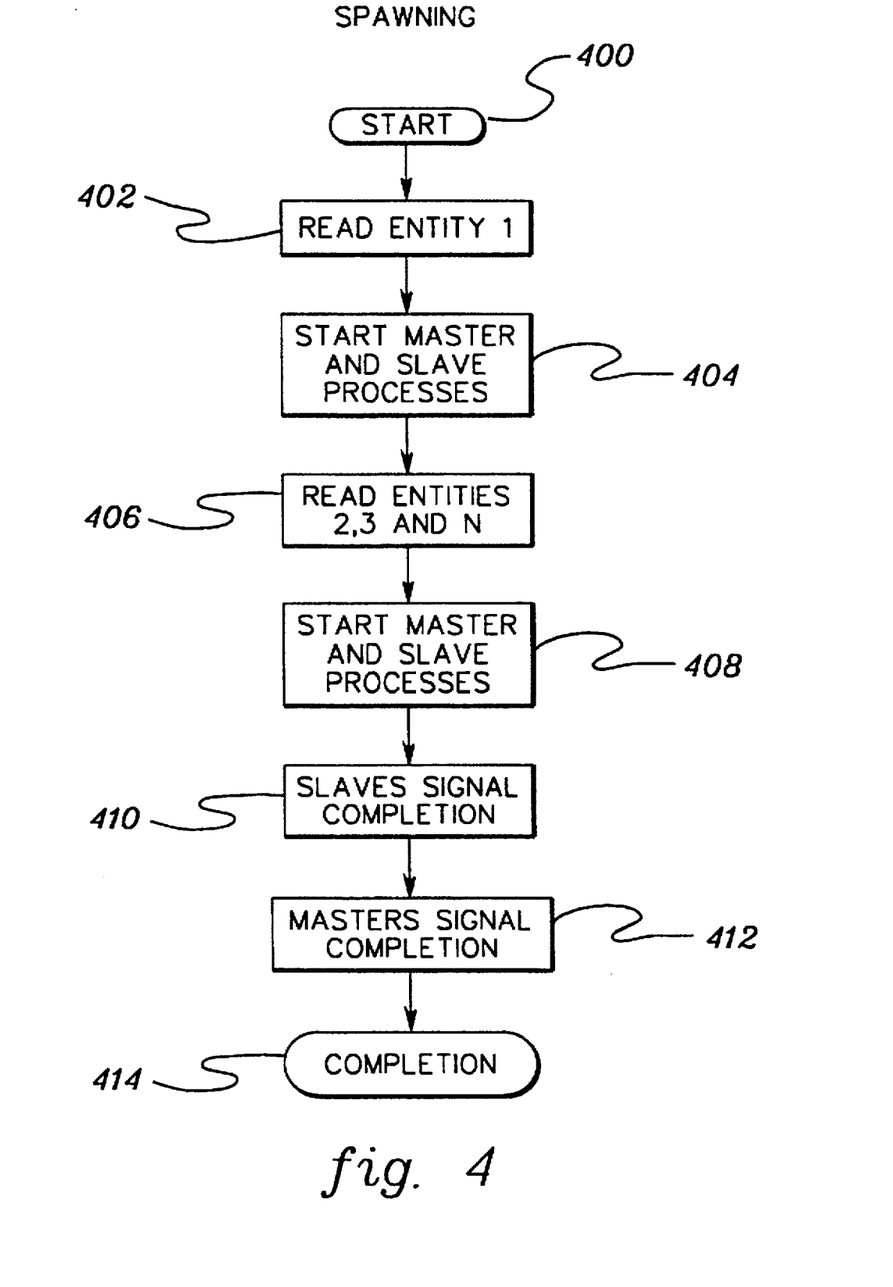
FIG. 4 depicts one embodiment of the logic associated with spawning, in accordance with the principles of the present invention.
Figure 5A:
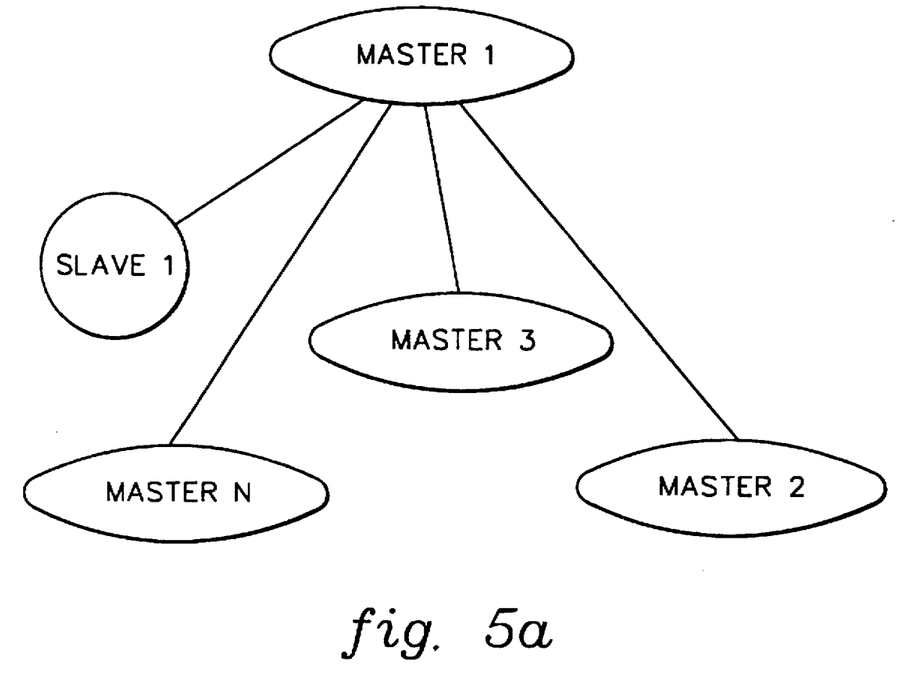
FIG. 5a illustrates one example of a root master process spawning its children, including a slave process and three master processes, in accordance with the principles of the present invention.
Figure 5B:
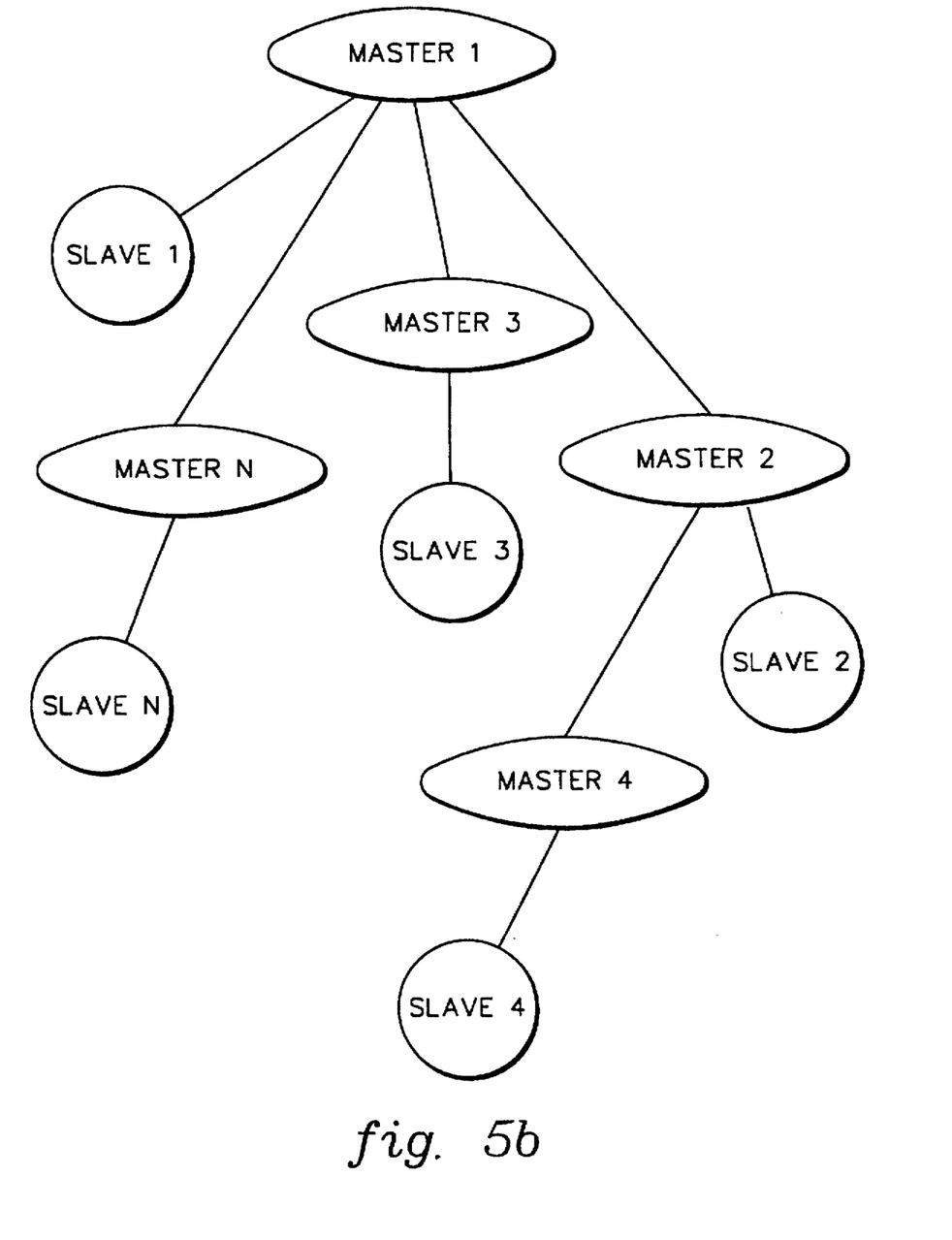
FIG. 5b illustrates further examples of master processes spawning their children, in accordance with the principles of the present invention.

As described above, in accordance with the principles of the present invention, in order to execute a complex task, the design, and therefore, the task, is partitioned into a plurality of entities and each entity is represented by at least one master process and one slave process. One technique for spawning master and slave processes, in accordance with the principles of the present invention, is described in detail with reference to FIGS. 4 and 5a-5b. FIG. 4 depicts the logic flow associated with spawning and FIGS. 5a-5b illustrate stages of the spawning process. It will be apparent to one of ordinary skill in the art that the flow described below is only one example. Steps may be added or deleted to the logic depending upon the degree of nesting of the entities. Those modifications are therefore, considered a part of the invention, as claimed.

Referring to FIG. 4, initially, spawning is started on the entity which contains the other entities (i.e., the containing entity), STEP 400 "START." In this example, the containing entity is entity 1. Thus, in order to begin spawning, a master process (referred to as MASTER 1 on FIG. 5a) is started and it reads the control file associated with entity 1, STEP 402 "READ ENTITY 1." The reading of the control file reveals that a master process needs to be started for entity 2, entity 3 and entity N. In addition, a slave process is started to handle the other circuits contained within entity 1, STEP 404 "START MASTER AND SLAVE PROCESSES."

After each of the master and slave processes are started, each submaster process executing in parallel (i.e., master process 2, master process 3 and master process N) reads a control file to determine its design, STEP 406 "READ ENTITIES 2, 3 AND N." During the read process, master process 2 determines that a master process needs to be started for entity 4 and thus, master process 4 is started. Thereafter, each of the submaster processes, which includes master processes 2, 3, 4 and N, starts a respective slave process, STEP 408 "START MASTER AND SLAVE PROCESSES." In one embodiment, the reading of the design, the starting of master process 4 and the starting of slave processes 2, 3, 4 and N are performed in parallel. The result of each master process spawning its children is depicted in FIG. 5b.

As each slave process completes its assignment of reading its entity and initializing itself, it signals completion to its master process, STEP 410. When each master process receives the completion signal from all of its children, it signals its parent master process of completion, STEP 412, until the root master process (e.g., master process 1) has received an indication of completion from each of its children, STEP 414. In one particular example, the completion signalling is as follows (Note that the signalling is in arbitrary order, depending upon the natural completion of the task at hand and that the following processing is being performed in parallel.):

Slave process 4 signals master process 4 it has completed reading its entity and initializing itself;

Slave process 3 signals master process 3 it has completed reading its entity and initializing itself;

Slave process 2 signals master process 2 it has completed reading its entity and intializing itself;

Master process 4 signals master process 2 it has completed reading its entity and spawning any children;

Slave process N signals master process N it has completed reading its entity and intializing itself;

Master process N not having any other children signals master process 1 it has completed reading its entity and spawning any children;

Master process 4 not having any other children signals master process 2 it has completed reading its entity and spawning any children;

Master process 3 not having any other children signals master process 1 it has completed reading its entity and spawning any children; and Master process 2 receiving completed signals from its two children signals master process 1 it has completed reading its entity and spawning any children.

Subsequent to master process 1 receiving all the completed signals from its children (e.g., slave process 1, master process 2, master process 3, master process 4, and master process N), master process 1 starts the next operation. In this embodiment, the next operation includes establishing connections between adjacent slave processes. An adjacent slave process is a slave process that needs to communicate with one or more other slave processes because of a path connecting one entity with another entity.

In one example, in order to establish connections between adjacent slave processes, a forward pin expansion command is issued in order to teach each slave process which slave process(es) it needs to communicate with. One example of propagating the forward pin expansion is described in detail below.

In one particular example, master process 1 propagates a forward pin expansion command (i.e., a connectivity command) to each of its children including, slave process 1, master process 2, master process 3 and master process N. As the children receive the command, they, in parallel, reissue the command to their children. For example, master process 2 reissues the forward propagate command to master process 4 and slave process 2; and master process 3, master process 4 and master process N reissue the command to their respective slave processes.

One example of a forward pin expansion is described in detail with reference to FIG. 6. For illustration purposes, an AND gate (gate (a)) has been added to the logic located within entity 4 and another AND gate (gate (b)) has been added to the logic within entity 1. There is a boundary pin P4 at the output of gate (a), a boundary pin P3 at the boundary of entity 4, a boundary pin P2 at the boundary of entity 2, and a boundary pin P1 at the input to gate (b). This particular example illustrates how entity 4 learns that pin P4 on gate (a) is connected to pin P1 on gate (b).

Prior to processing the forward pin expansion command, the master and slave processes are taught the identifiers for the boundary pins. This is accomplished during the spawning process, described above. For example, master process 1 knows that pin P1 is connected to pin P2 of entity 2, since master process 1 knows the design at the level of entity 1. Master process 1, when it spawned its children, assigned unique identifiers to all the boundary pins of the children. The children receive these identifiers as part of their initialization information. As one example, the identifiers are integer numbers, but in this example are referred to as P1, P2 ... P4. Similarly, each submaster assigns identifiers to each boundary pin of its children and teaches its children what the identifiers are. This process continues until the design is expanded according to user specification. Slave processes are also taught the identifiers for the boundary pins.

During forward pin expansion, connectivity and replacement relations are formed in parallel, as described in detail below. For instance, a connectivity relation is formed by master process 1 between pin P1 and pin P2. In this example, the connectivity relation is noted as the following: M2.P2==M1.b.P1, wherein pin P2 of master process 2 is connected with pin P1 of gate (b) of master process 1. Further, master process 2 forms a connectivity relation with pin P3 of master process 4 (i.e., M2.P2==M4.P3), and master process 4 forms a connectivity relation between pin P4 and pin P3 (i.e., M4.a.P4==M4.P3).

In addition to the above, replacement relations are formed, as described below, and the replacement information is passed back to the parent process. As defined herein, a replacement relation is information which communicates the identity of a child to its parent. The parent takes the replacement relation and applies it to the connectivity relations it knows, in order to enable direct communication between slave processes. In one example, a replacement relation is formed by slave process 1 (S1), such that slave process 1 replaces master process 1 (M1). In this example, for clarity purposes, replacement relations are noted as follows: M1←S1, in which slave process 1 replaces master process 1. Additionally, slave process 2 replaces master process 2 (M2←S2) and slave process 4 replaces master process 4 (M4←S4).

Subsequent to each master process receiving a response from all its children that the replacement relations are formed, the master processes process the pin information, as described below. In particular, when master process 4 receives a response from all its children (e.g., slave process 4), it uses the replacement relation M4←S4 to generate the connectivity relation S4.a.P4==S4.P3. Additionally, master process 4 builds a routing table: S4 via S4, which in this example is degenerate. Although in this example the routing table is degenerate, it is convenient to have entries in the routing table, even degenerate entries. Thus, if a search fails to find an entry in the routing table, then it knows that an error has occurred.

Since master process 4 is a child of master process 2, master process 4 sends to master process 2 the connectivity relation S4.a.P4==S4.P3 and the replacement relation M4←S4. Now that master process 2 has information from all of its children (e.g., S2, M4), master process 2 uses the replacement relations M2←S2, M4←S4 to produce the connectivity relation S2.P2==S4.P3. Additionally, master process 2 generates a routing table: S2 via S2, S4 via M4.

Thereafter, master process 2 processes the connectivity relation from master process 4, obtaining S2.P2==S4.a.P4. Next, master process 2 sends master process 1 the routing table: S2 via M2, S4 via M2, the replacement relation M2←S2 and the connectivity relation S2.P2==S4.a.P4. Master process 2 does not send the replacement relation M4←S4 since there is no way that any process that is not a child of master process 2 could possibly know about connections involving master process 4, at this time.

At this point, master process 1 has responses from its children master process 2 and slave process 1. Master process 1 possesses the information that pin P2 of master process 2 is connected to pin P1 of gate (b) of master process 1 (i.e., M2.P2==M1.b.P1). Master process 1 receives from slave 1 the replacement relation M1←S1 and from master process 2 the replacement relation M2←S2. Further, master process 1 receives from master process 2 the routing table: S2 via M2, S4 via M2, and the connectivity relation S2.P2==S4.a.P4.

After master process 1 receives the information, master process 1 does a replacement, obtaining S2.P2==S1.b.P1.

Additionally, master process 1 forms its routing table: S1 via S1, S2 via M2, S4 via M2. Thereafter, master process 1 does its connections, obtaining S4.a.P4==S1.b.P1.

The above procedure is performed for all such connections and replacements in the system. This phase of the procedure moves leaf information up the tree. The information that concerns only processes in a subtree rooted in a master stays in the subtree, and is not propagated upwards. The information that concerns processes outside of a subtree is propagated upwards.

Subsequent to performing all of the connections and replacements in the system, and when the root master, master process 1, receives all of the responses, a synchronization point is reached. At this point, connectivity information exists at each master process. Each master process holds information concerning paths that go through its entity and paths that stay within its entity. Paths contained within an entity are expressed at the entity's master and do not get propagated higher up the tree. Each master has a routing table which describes where to route information destined for the leaves (i.e., slave processes) in the subtree rooted at that master process.

After the above is complete, the connection process is run in reverse. Master process 1 starts it off because it is the root master. Master process 1 looks at all of its connection information and routes the connection to both of the slave processes in the connection, as described below. In this example, the connection is S4.a.P4==S1.b.P1, and master process 1 uses its routing table (S1 via S1, S4 via M2) to send a copy of this connectivity relation to slave process 1 and master process 2.

The following events are performed in parallel:

(1) Slave process 1 receives the relation. Slave process 1 knows that it is a slave and that when the negotiation process occurs, it must discuss its own pin P1 of gate (b) with slave S4, pin P4 of gate (a).

(2) Master process 2 receives the connectivity relation S4.a.P4==S1.b.P1 from master process 1. It is conventional to route received relations to the left hand side only. Thus, master process 1 ordered the relation so slave process 4 would be on the left.

(3) Master process 2 looks in its routing table and finds S4 via M4, so it sends the relation on to master process 4.

(4) Master process 4 receives the relation S4.a.P4==S1.b.P1 from master process 2. Master process 4 looks in its routing table and finds S4 via S4, so it sends the relation on to slave process 4.

(5) Slave process 4 receives the relation S4.a.P4==S1.b.P1 from master process 4. Slave process 4 knows that it is a slave and that when the negotiation phase occurs, it must discuss its own pin P4 of gate (a) with slave S1, pin P1 of gate(b).

The above procedure will continue for all connection information in the system. This phase of the procedure moves connections down from the root of the trees to the slaves at the leaves, via intermediate masters. Essentially, this phase cross-pollinates information from the left and right half of all subtrees in the system. When this procedure is complete, each slave knows which other slaves it must communicate with, and knows what pins must be discussed. This procedure establishes the slave-to-slave communications pattern. Now all topology and timing information can flow between slaves. Masters will participate only in command flow. Slaves do all of the data flow. The above greatly reduces communications load because commands are small and data are large. This permits data to go directly from its source to its intended target, without having to divert to intermediate tree nodes (i.e., master processes) to get where it needs to go.

When the above procedure is over, a two-way communication between those slave processes that have to exchange information about the design is established. As used herein, a slave process that has to exchange information with another slave process or slave processes is said to be coupled or adjacent to the other slave process(es). The coupled slave processes have learned which inputs and outputs of theirs are connected to pins of other slave processes.

One example of adjacency between the slave processes is depicted in FIG. 7. A dotted line is used to show which slave processes are adjacent to other slave processes. In one embodiment, the following adjacencies exist:

Slave process 4 is adjacent to slave process 1 because of path I;

Slave process N is adjacent to slave process 2 because of path II;

Slave process 3 is adjacent to slave process 2 because of path III;

Slave process 2 is adjacent to slave process N because of path IV;

Slave process N is adjacent to slave process 3 because of path V; and

Slave process 1 is adjacent to slave process N because of path VI.

In accordance with the principles of the present invention, it is possible that there may be more than one logical connection between one slave process and another slave process. In the above example, there are two distinct logical connections between slave process 2 and slave process N. The one adjacency path IV carries within it the fact that there are two distinct connections. This increases the amount of information transmitted during a single communication.

Adjacency between slave processes is described above. Slave processes are adjacent because there is one or more logical connections between the entities of the design. Thus, adjacency can also be discussed in terms of entities. For example, entity 4 is adjacent to entity 1, entity N to entity 2, entity 3 to entity 2, entity 2 to entity N, entity N to entity 3, and entity 1 to entity N.

Subsequent to master process 1 receiving a completed signal from all of its children indicating that the adjacency communication has been established, master process 1 proceeds to the next operation. In one embodiment, the next operation includes exchanging the physical design information including, but not limited to, pin capacitance, wire capacitance, resistance, and number of loads. Specifically, the physical design information typically includes the pieces of data required to perform the complex task. In one embodiment, the complex task is a static timing operation and thus, the physical design information includes the data required to compute delays based on the physical properties of the part being designed. In the situation where there is no physical design as of yet (perhaps no placement and no wires yet), it is still possible to know the topology of the connections, and how many loads and of what kind are being driven, etc. Further, it is possible to estimate the wire length and other physical properties.

The physical information is exchanged between the slave processes in both directions along the adjacencies. For example, for path IV, slave process 2 needs to know what kind of topology within slave process N is driven by the output(s) from slave process 2, and slave process N needs to know what in slave process 2 is driving it.

After the physical information is exchanged in both directions, each child informs its parent that it has completed its task. When master process 1 receives the completed signal from all of its children, it proceeds to the next operation, which is the actual performance of the complex task. In this example, it is the start of the system timing operation. Static timing is described in, for example, *EinsTimer: Basic Services Reference*, International Business Machines Corporation, Publication Number 0220-5551-00 (1994), which is hereby incorporated herein by reference in its entirety. One example of the system timing operation, in accordance with the principles of the present invention, is described below.

Initially, each slave process assumes one or more user specified default arrival times (e.g., zero) for each circuit within its associated entity. An arrival time is defined as the sum of all the delays in a path from an input to an output (SUM 1), or the sum of all the delays in a path from an input to a storage device (SUM 2), or a sum of all the delays in a path from a storage device to an output (SUM 3), plus the arrival time at the start of the path (AT), (i.e., Arrival Time=(SUM 1 or SUM 2 or SUM 3)+AT). Using the initial arrival times, each slave process computes delays and output arrival times for each of the circuits in its entity.

For example, master process 1 commands its children, master process 2, master process 3, master process N and slave process 1, to perform the timing calculation. In particular, master process 2, master process 3, and master process N command their respective children to perform the calculation, since the slave processes are responsible for the actual calculations. Additionally, master process 2 commands master process 4 to perform the timing operation, which in turn commands slave process 4 to perform the calculation. All of the slave processes perform the timing calculations (e.g., the calculation of the output arrival times) using the initial arrival times.

Delay and output arrival time calculations are known to those of ordinary skill in the art. As one example, current products offered by International Business Machines Corporation perform diagnostic timing analysis during verification tests. The calculations used in those products can be employed in the technique of the present invention. As specific timing calculations vary from machine to machine and situation to situation, different calculations may be used. For example, each technology may have a particular delay equation with coefficients that are dependent upon the logic circuits. The coefficients can be found, for instance, for a given operating temperature and power supply voltage. The equation would be a function of, for example, input transition time and load (i.e., interconnect capacitance and resistance.)

One example of a delay equation, which may be generalized, is as follows: $((K_1+K_2 \times C_L)T_x+K_3 \times C_L+K_4 \times C_L+K_5)$, where K represents constants which are dependent on, for example, the circuit, the technology and operating conditions, such as temperature and voltage, $C_L$ represents the load capacitance, and $T_x$ represents the input transition time.

As each slave process finishes its calculations, it sends a completed signal to its master process. The completed signal reflects whether the calculations caused an arrival time at a circuit's output to change. For instance, the signal indicates a change between the output arrival time of a circuit and a previous output arrival time of the circuit. Each respective master process collects the completed signals from all its children, and when it receives all the completed signals, it forwards its own completed signal to its master process.

If all of a master process's children signal completed with no change, then the master process relays the no change along to its master process. Otherwise, the master process signals complete with change. This allows the root master process, master process 1, to determine when the timing run converges. If all of the children of the root master process signal complete with no change, then the system has converged and the solution has been found.

When a slave process signals to its master process that there was a change, it indicates to the master process that there was a delta change. When the root master process receives the completed signal from all its children, master process 1 notices that at least one has signaled a change. Master process 1 proceeds to the next operation, which includes commanding all its children to forward propagate their changed output arrival times to whoever needs to see them. This is performed in parallel and proceeds similar to the propagation of forward pin expansion described above. Specifically, the command flows through submaster processes (e.g., master process 2, master process 3, master process 4, and master process N) and on to the slave processes. When the slave processes receive this command, they tell the slave processes to which they are adjacent about any changes in arrival time information at their boundaries. Since adjacent slave processes talk to one another (also referred to as leaf-to-leaf communication) only about the changes, communication is minimized, thereby increasing processing performance.

In this embodiment, the communication is directed such that a slave process is interested in receiving information about its inputs and in sending information about its outputs. For example, slave process N sends changes in its outputs to slave process 3 and slave process 2. Slave process N receives changes from the outputs of slave process 2 and slave process 1. Slave process N, in this example, sends to and receives from slave process 2, but it only sends to slave process 3.

A slave process sends to each adjacent slave process information about the number of changes and what changed. In one embodiment, a slave process with no changes will send an indication of zero changes. This forces a minimum communication to occur, so that the system can tell the difference between a slave process with no changes and one whose network traffic was somehow lost or misrouted.

In one embodiment, the transmitted change information remains queued at the recipient slave processes, until the slave processes are commanded to read the change information. Once again, only changes are sent so the network traffic generally decreases as the procedure is executed.

As each slave process working in parallel finishes transmitting its changes to adjacent slave processes, that slave process sends a completion signal to its master process. Each respective master process collects completed signals from all of its children. When all of the children signal completed, then the master process forwards its own completed signal to its master process.

When master process 1 receives the completed signal from all its children, it proceeds to the next operation. In one example, master process 1 tells its children to read the change information. This command moves down the tree in a similar manner to the other commands described above, until it reaches each slave process. In parallel, each slave process reads the change information and uses the information to recalculate their output arrival times. After a slave processes the change information, it sends a completed signal to its master process, as described above.

Similar to the command execution described above, each master process collects its completed signals from its children and when all are collected, it indicates completion to its master process until the root master process receives a completed signal from each of its children.

When the root master process receives the completed signal from all its children, it determines if there are any changes. If there are changes, the timing process is repeated, as described above. In one embodiment, it is possible to place a limit on the number of iterations to be performed. If that number is exceeded, then the process is stopped and an error condition is indicated. This is useful, for example, when there is a loop within the design between entities.

When the root master process has received an indication that all slave processes completed with no changes, then the system has converged on an answer. Therefore, backward propagation of the output arrival times is performed. This is done in a manner similar to that described above with reference to the forward propagation of the arrival times, except the information flows in the reverse direction, and instead of exchanging changes from outputs to inputs, the slave processes exchange required arrival time information from inputs to outputs. The reverse process is repeated until convergence. Once the reverse process converges, the system is done and timing results are available for analysis.

Described above in detail is the partitioning of a complex task into a plurality of entities for parallel execution. Each entity is represented by at least one master process and one slave process. The master processes schedule the operations to be performed and the slave processes perform the operations. Communication between the slave processes is direct, such that the master processes do not have to be involved in the communication between the slave processes.

In a further embodiment of the invention, the technique may be performed asynchronously such that, for instance, the submasters may send responses to its master prior to receiving all of the responses from its children.

In accordance with the principles of the present invention, a new entity may replace an existing entity providing incremental substitution for the design. The new entity can be of a different structure as long as the boundary connections are similar.

In another embodiment of the invention, each master and slave process has a shadow, which monitors the health of its respective process. For example, each slave process has a shadow slave process for monitoring the health of its associated slave process. Similarly, each master process has a master shadow for overseeing the health of its respective master and for accepting acknowledgements prior to passing them on to its master process. Therefore, if the master goes down, the master shadow can restart another master process at the same point in sequence.

In another embodiment of the invention, there is only one master process (e.g., master process 1), instead of a master process for each entity. The one master process is in charge of scheduling the commands for all of the slave processes and the slave processes continue to communicate directly to one another.

In yet another embodiment, the master and slave processes are combined as one process, such that one process performs both the controlling functions of a master process and the computational functions of a slave process.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A system for executing complex static timing tasks in a computer system comprising one or more processors, said system comprising:

means for partitioning a complex static timing task into a plurality of entities;

means for starting a master process and a slave process for each of at least two of said plurality of entities, wherein the master processes and the slave processes of the at least two of said plurality of entities together form a hierarchical arrangement of processes in said system, the hierarchical arrangement of processes having at least one of the master processes subservient to another of the master processes therein, wherein a slave process of one of said at least two of said plurality of entities is coupled to a slave process of one other entity of said at least two of said plurality of entities;

means for establishing a direct communication path between said coupled slave processes for communicating between said coupled slave processes independent of their respective master processes, the hierarchical arrangement of processes thereby having at least one pair of coupled slave processes from different master processes in direct communication with each other;

means for executing said master processes and said slave processes on said one or more processors, wherein said master processes schedule operations to be performed by their respective said slave processes for said complex static timing task and said slave processes perform said operations in parallel; and means for providing a result of said operations performed in parallel to a user of said computer system.

2. The system of claim 1, further comprising means for executing said master processes and said slave processes in parallel.

3. A system for executing complex static timing tasks in a computer system comprising one or more processors, said system comprising:

means for partitioning a complex static timing task into a plurality of entities;

means for starting a master process and a slave process for each of at least two of said plurality of entities, wherein the master processes and the slave processes of the at least two of said plurality of entities together form a hierarchical arrangement of processes in said system, the hierarchical arrangement of processes having at least one of the master processes subservient to another of the master processes therein, wherein a slave process of one of said at least two of said plurality of entities is coupled to one or more other slave processes of said at least two of said plurality of entities;

means for establishing direct communication paths between any coupled slave processes for communicating between said coupled slave processes independent of their respective master processes, the hierarchical arrangement of processes thereby having at least one pair of coupled slave processes from different master processes in direct communication with each other;

means for executing said master processes and said slave processes on said one or more processors, wherein said master processes schedule operations to be performed by their respective said slave processes for said complex static timing task and said slave processes perform said operations in parallel thereby reaching a result;

means for thereafter substituting one of said plurality of entities with a replaceable entity, wherein at least one other entity of said plurality of entities is retained and operations relevant only to the replaceable entity are thereafter performed to thereby reach a new result; and means for providing the new result to a user of said computer system.

4. The system of claim 3, wherein said replaceable entity has a different structure from said one of said plurality of entities being replaced.

5. The system of claim 1, further comprising means for creating a shadow master process for each of said master processes and a shadow slave process for each of said slave processes, each shadow master process and each shadow slave process monitoring its respective process.

6. A system for executing complex static timing tasks in a computer system comprising one or more processors, said system comprising:

means for partitioning a complex static timing task into a plurality of entities;

means for starting a master process and a slave process for each of at least two of said plurality of entities, wherein the master processes and the slave processes of the at least two of said plurality of entities together form a hierarchical arrangement of processes in said system, the hierarchical arrangement of processes having at least one of the master processes subservient to another of the master processes therein, wherein a slave process of one of said at least two of said plurality of entities is coupled to one or more other slave processes of said at least two of said plurality of entities;

means for establishing direct communication paths between any coupled slave processes for communicating between said coupled slave processes independent of the respective master processes, the hierarchical arrangement of processes thereby having at least one pair of coupled slave processes from different master processes in direct communication with each other;

means for executing said master processes and said slave processes on said one or more processors, wherein said master processes schedule operations to be performed by their respective said slave processes for said complex static timing task and said slave processes perform said operations in parallel; and means for providing a result of said operations performed in parallel to a user of said computer system.

7. The system of claim 6, wherein said one of said at least two of said plurality of entities is at least a partial decomposition of another of said plurality of entities.

8. The system of claim 6, wherein the means for establishing direct communication paths between any coupled slave processes includes:

means for executing the master processes in parallel while establishing the paths for the coupled slave processes.

9. The system of claim 3, wherein said one of said at least two of said plurality of entities is at least a partial decomposition of another of said plurality of entities.

10. The system of claim 3, wherein the means for establishing direct communication paths between any coupled slave processes includes:

means for executing the master processes in parallel while establishing the paths for the coupled slave processes.

11. The system of claim 1, wherein said one other entity of said at least two of said plurality of entities is at least a partial decomposition of another of said plurality of entities, wherein the another of said plurality of entities comprises said one of said at least two of said plurality of entities or a different one of said plurality of entities.

12. The system of claim 1, wherein the means for establishing a direct communication path between said coupled slave processes includes:

means for executing the master processes in parallel while establishing the paths for the coupled slave processes.

* * * * *